(12) United States Patent
Mollard et al.

(10) Patent No.: US 9,178,101 B2
(45) Date of Patent: Nov. 3, 2015

(54) P-N DIODE HAVING A CONTROLLED HETEROSTRUCTURE SELF-POSITIONED ON HGCDTE, FOR INFRARED IMAGERS

(71) Applicant: COMMISSARIAT A L'ENERGIE ATOMIQUE ET AUX ENE ALT, Paris (FR)

(72) Inventors: Laurent Mollard, Seyssinet-Pariset (FR); Nicolas Baier, Biviers (FR); Johan Rothman, Lans en Vercors (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/359,216

(22) PCT Filed: Nov. 26, 2012

(86) PCT No.: PCT/EP2012/073629
§ 371 (c)(1),
(2) Date: May 19, 2014

(87) PCT Pub. No.: WO2013/079446
PCT Pub. Date: Jun. 6, 2013

(65) Prior Publication Data
US 2014/0319580 A1    Oct. 30, 2014

(30) Foreign Application Priority Data
Nov. 28, 2011  (FR) ..................................... 11 03617

(51) Int. Cl.
*H01L 29/04* (2006.01)
*H01L 29/66* (2006.01)
(Continued)

(52) U.S. Cl.
CPC ........ *H01L 31/109* (2013.01); *H01L 31/02966* (2013.01); *H01L 31/1032* (2013.01); *H01L 31/1832* (2013.01)

(58) Field of Classification Search
CPC ........................ H01L 27/1214; H01L 29/6659
USPC ........................................ 257/59, 71; 438/197
See application file for complete search history.

(56) References Cited

U.S. PATENT DOCUMENTS 4,137,544 A * 1/1979 Koehler ........................ 257/442
4,791,467 A  12/1988 Amingual et al.
(Continued)

FOREIGN PATENT DOCUMENTS

EP         0 229 574        7/1987

OTHER PUBLICATIONS

J.M. Arias, et al., "MBE HgCdTe heterostructure p-on-n planar infrared photodiodes", Journal of Electronic Materials, vol. 22, No. 8, 1993, pp. 1049-1053.
(Continued)

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

A device including at least one heterostructure p/n diode, including a substrate based on HgCdTe including for each diode: a first part having a first cadmium concentration; a concentrated part, having a second cadmium concentration, greater than the first concentration, forming a heterostructure with the first part; a p+ doped zone situated in the concentrated part and extending into the first part, forming a p/n junction with an n-doped position of the first part, or a base plate; and the concentrated part is only located in the p+ doped zone and forms a substantially constant cadmium concentration well.

13 Claims, 7 Drawing Sheets

(51) Int. Cl.
  *H01L 31/109* (2006.01)
  *H01L 31/103* (2006.01)
  *H01L 31/0296* (2006.01)
  *H01L 31/18* (2006.01)

(56) References Cited

U.S. PATENT DOCUMENTS

| | | | |
|---|---|---|---|
| 5,466,953 A * | 11/1995 | Rosbeck et al. | 257/185 |
| 7,936,034 B2 | 5/2011 | Rothman | |
| 8,232,560 B2 | 7/2012 | Robin et al. | |
| 8,541,256 B2 * | 9/2013 | Wan | 438/84 |
| 2003/0071221 A1 | 4/2003 | Mitra | |
| 2007/0034898 A1 | 2/2007 | Tennant et al. | |
| 2007/0197022 A1 * | 8/2007 | Hails et al. | 438/625 |
| 2014/0183682 A1 | 7/2014 | Rothman | |
| 2014/0183683 A1 | 7/2014 | Rothman | |

OTHER PUBLICATIONS

International Search Report Issued Jan. 4, 2013 in PCT/EP12/073629 Filed Nov. 26, 2012.

* cited by examiner

P-N DIODE HAVING A CONTROLLED HETEROSTRUCTURE SELF-POSITIONED ON HGCDTE, FOR INFRARED IMAGERS

FIELD OF THE INVENTION

The present invention relates to the field of diodes manufactured in semiconductor materials. The invention relates more specifically to p/n type diodes formed in substrates based on $Hg_{1-x}Cd_xTe$ type materials, which may be used for infrared imagers.

STATE OF THE RELATED ART

P/N diodes are generally formed in a substrate 100.0 having mostly n doping. They comprise in this substrate 100.0 an n doping region, called the base plate 1.0 (FIG. 1) and a p+ doped zone 9.0, or p doping zone, adjacent to the base plate 1.0. The interface between the n doping region 1.0 and the p+ doped zone 9.0 is commonly referred to as the "p/n junction" 10.0. At thermodynamic equilibrium, a space charge zone 7.0 is formed on either side of the p/n junction 10.0. At a first boundary 7.1 of the space charge zone 7.0, the n-doped base plate 1.0 is positively charged and at a second boundary 7.2 of the space charge zone, the p+ doped zone 9.0 is negatively charged inducing an intense electric field.

Figure 1:
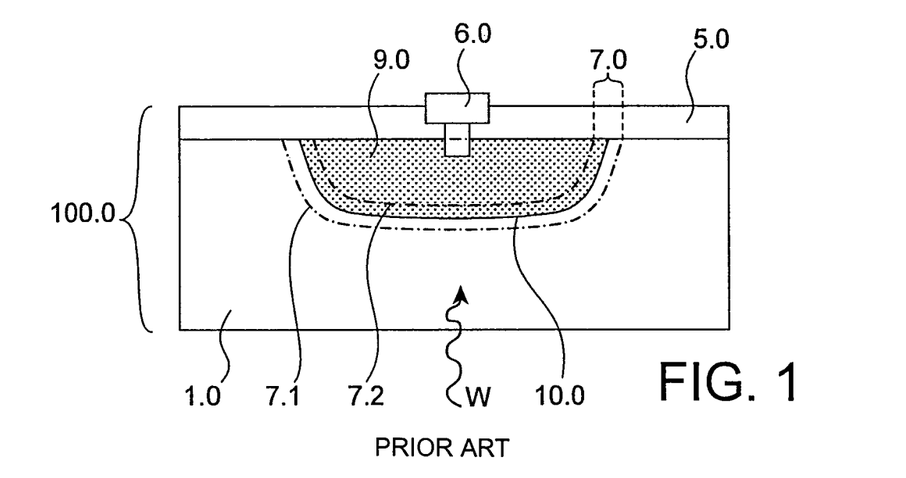
FIG. 1 illustrates a heterostructure p/n diode according to the prior art.

When an electromagnetic wave W penetrates the substrate via the base plate 1.0, it forms an electron-hole pair by interacting with atoms of the material of the base plate 1.0. A minority carrier in the base plate, in this case a hole, diffuses from a hole diffusion length in the base plate 1.0 before recombining with a majority carrier, in this case an electron. If the minority carrier diffuses to the space charge zone 7.0, it is not recombined immediately. It is accelerated by the electric field to the p+ doped zone 9.0. It is recombined therein forming a reverse current between the p+ doped zone 9.0 and the n doping base plate 1.0.

If the electromagnetic wave W passes through the base plate 1.0 and the generation of the electron/hole pair takes place in the space charge zone 7.0, the pair is instantaneously separated by the electric field. The hole is directed towards the second boundary 7.2 and towards the p+ doped zone 9.0 and the electron towards the first boundary 7.1 and towards the n doping base plate 1.0. This phenomenon is rarer than the previous phenomenon and generally requires that the base plate 1.0 is very thin, the electromagnetic wave W having to pass through the entire base plate 1.0.

A p/n diode is only sensitive to wavelengths wherein the energy is sufficient to have an electron pass the material gap of the base plate 1.0 to form electron/hole pairs. It is thus necessary for an electromagnetic wave to have a minimum energy in order to be detected. Conversely, if the electromagnetic wave has an energy considerably greater than the gap, the electromagnetic wave interacts significantly with the base plate 1.0 and the majority of electron/hole pairs are formed too far from the p/n junction and the holes are recombined with a majority carrier without enabling detection of the wave. In this way, the material gap of the base plate 1.0 defines a minimum wavelength that can be detected by the diode and a range of wavelengths suitable for optimal detection.

In a diode made of $Hg_{1-x}Cd_xTe$ material, the material gap, and thus the range of wavelengths detected by this diode, is dependent on the cadmium concentration in the base plate 1.0. A low cadmium concentration ensures a small gap for the diode and the detection of electromagnetic waves with a long wavelength. However, a small gap gives rise to increased sensitivity of the diode to defects and a greater dark current. In particular, if there are defects in a material, the gap is artificially reduced at some localised points of the material. In a material with a small gap, this artificial reduction is greater in proportion to the gap.

The dark current is an imperfection of photodiodes caused by thermal agitation. To a certain extent, the thermal agitation may supply sufficient energy to some electrons to form an electron-hole pair by spontaneous generation. If the hole formed by spontaneous generation appears in the space charge zone or near the p/n junction, a current is formed in the absence of an incident electromagnetic wave on the diode.

Figure 2A:
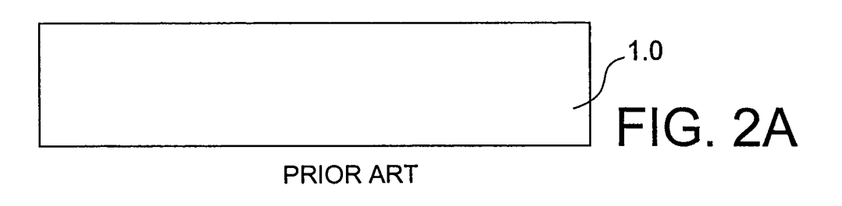
FIGS. 2A to 2G illustrate various steps of a method for producing a heterostructure p/n diode according to the techniques of the prior art.
Figure 2B:
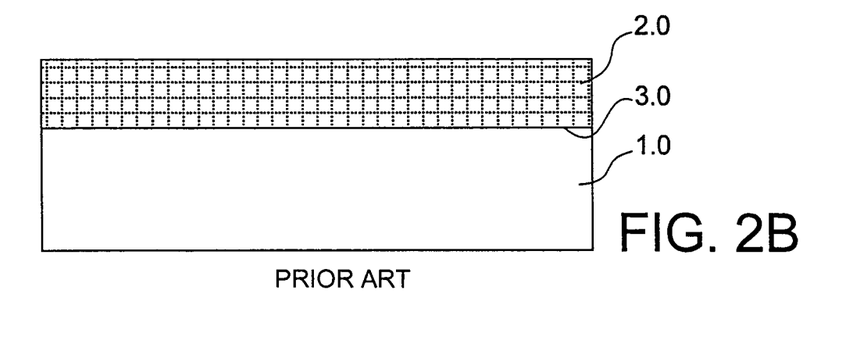
Figure 2C:
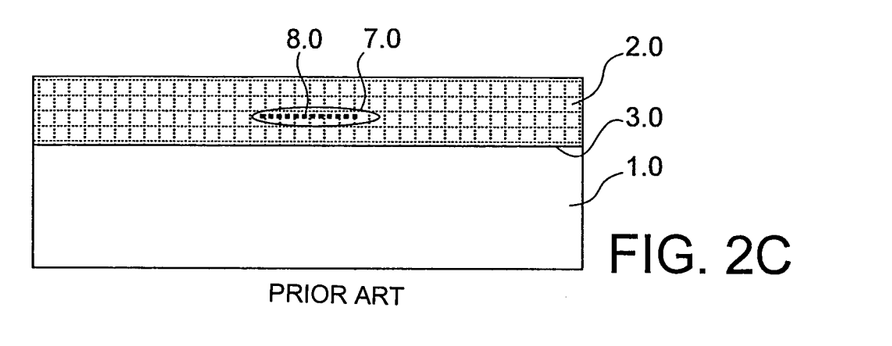
Figure 2D:
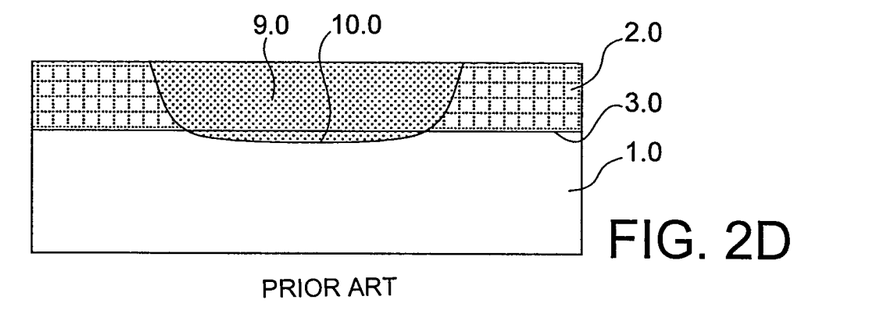
Figure 2E:
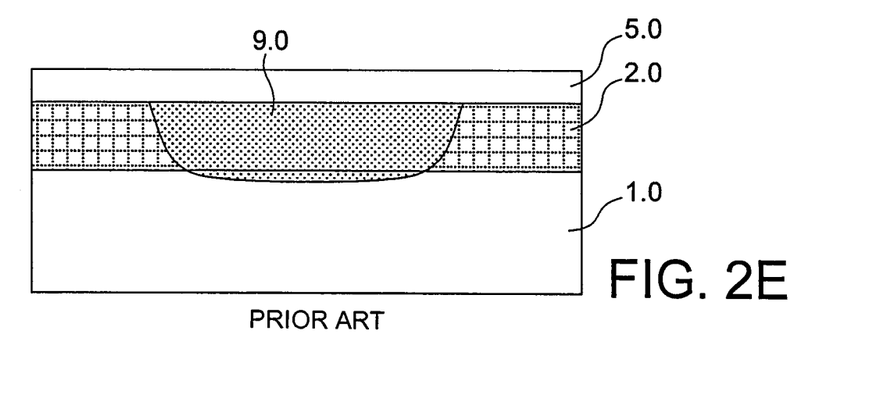
Figure 2F:
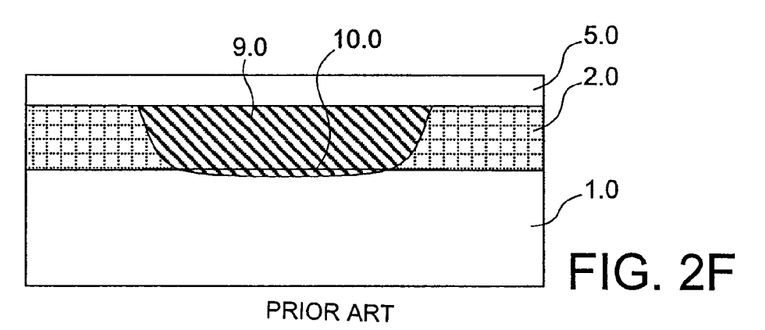
Figure 2G:
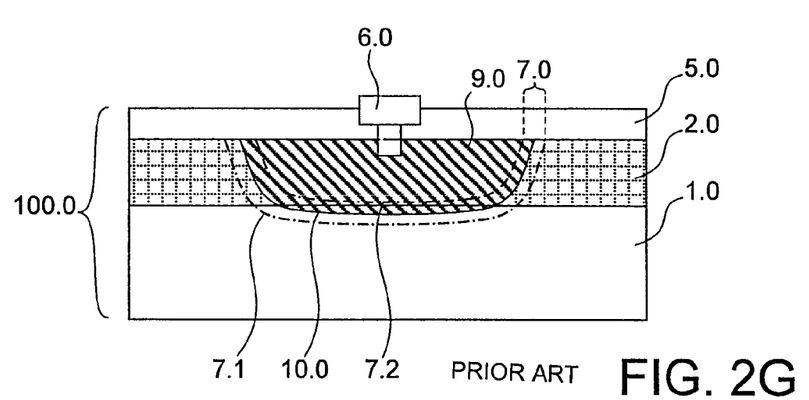

To limit the dark current in infrared images with a small gap, one option is that of producing so-called "heterostructure" diodes as illustrated in FIG. 2G. Such a structure and method are described in the article "MBE HgCdTe Heterostructure p-on-n Planar Infrared Photodiodes" by J. M Arias et al. published in 1993 in "Journal of Electronic Materials", volume 22, number 8, pages 1049 to 1053. Producing a heterostructure diode involves forming a p/n diode, having a p/n junction 10.0 and a space charge zone 7.0 around same, such that the base plate 1.0 of the diode is made of a material having a small gap, but that the p/n junction 10, or in particular the second boundary 7.2 of the space charge zone 7.0 is made of a material having a larger gap. In this case, the spontaneous generation of electron-hole pairs in the space charge zone 7.0 is reduced, since the energy to be supplied to form an electron-hole pair is greater than in the base plate 1.0. In this case, the diode is less sensitive to defects and the dark current.

However, it is necessary to be able to recover the current produced by absorbing an electromagnetic wave in the base plate 1.0. The p/n junction 10.0 should then be situated sufficiently close to the base plate 1.0 having a small gap, more particularly such that the first boundary 7.1 of the space charge zone 7.0 is in the base plate 1.0 with a small gap.

In this way, the diode is such that the majority of the p+ doped zone 9.0 is situated in a portion of the substrate 100.0 having a greater cadmium concentration than the base plate 1.0 without being in the passivation layer 5.0 wherein one of the elements is cadmium Cd. Such a design enables the diode to be able to detect a range of wavelengths comprising short wavelengths, dependent on the gap of the base plate 1.0, while being less sensitive to noise, the dark current and defects than a non-heterostructure diode.

Those skilled in the art know how to use, to form a heterostructure diode, a substrate 100.0, wherein the base plate 1.0 is formed from a base layer of the type $Hg_{1-x}Cd_xTe$, where "x" equals for example 0.22, and a surface layer 2.0, made of $Hg_{1-y}Cd_yTe$ where "y" has a value greater than that of "x", for example 0.28, in contact with the base plate 1.0. The surface layer 2.0 has a larger gap than the base plate 1.0. The term heterojunction 3.0 denotes the interface between the base plate 1.0 and the surface layer 2.0.

A p+ doped zone 9.0, or p doping zone, is then formed in the surface layer 2.0 so that the p+ doped zone 9.0 has a thickness greater than that of the surface layer 2.0 and protrudes slightly from the heterojunction 3.0. A p/n junction 10.0 is defined by an interface between the p+ doped zone 9.0 and the n-doped base plate 1.0. The p/n junction 10.0 protrudes from the surface layer 2.0 such that at least the first boundary 7.1 of the space charge zone 7.0 is situated in the base plate 1.0. The p/n junction 10.0 is then positioned in a zone of the base plate 1.0 wherein cadmium from the surface layer 2.0 may have diffused slightly.

Usually, such a diode based on $Hg_{1-x}Cd_xTe$ is coated with a passivation layer 5.0 wherein one of the elements is cadmium Cd, to stabilise the diode. Furthermore, to operate the diode, a conductor contact 6.0 is present in the p+ doped zone 9.0 to recover any current produced in the diode.

A method for producing a heterojunction diode according to the prior art is described in FIG. 2A to 2G.

Firstly, an initial substrate acting as a base plate 1.0 made of $Hg_{1-x}Cd_xTe$ is chosen (FIG. 2A). The value of "x" may be for example 0.22. This value is chosen such that the $Hg_{1-x}Cd_xTe$ gap is the desired gap for detecting given electromagnetic waves which have a minimum energy corresponding to this gap. The base plate 1.0 may typically have a thickness from some tenths of micrometers to some tens of micrometers, for example 10 µm.

Preferably, the base plate 1.0 initially comprises n doping established using one or more donor type dopants, introduced during the manufacture thereof. Without the introduction of extrinsic dopants, the base plate 1.0 may be of the n or p type.

On top of the base plate 1.0, as illustrated in FIG. 2B, by molecular beam epitaxy or by liquid phase epitaxy, a surface layer 2.0 made of $Hg_{1-y}Cd_yTe$ where "y" has a value strictly greater than that of "x", for example 0.28, is formed. The surface layer 2.0 may have a thickness of, for example, 1 µm. It forms a substrate 100.0 with the base plate 1.0. The interface 3.0 between the base plate 1.0 and the surface layer 2.0 is called a heterojunction 3.0.

Subsequently, an acceptor type dopant 8.0 is introduced into a doping zone situated in the surface layer 2.0 by means of ion implantation (FIG. 2C). The ion implantation implants the dopant 8.0 at a defined depth in the form of dopant atoms, and forms an implantation zone 70.0 containing the dopant 8.0.

Diffusion of the dopant 8.0 is then performed. The diffusion displaces the dopant atoms and thus creates a conventional form of doping region for a p/n diode (FIG. 2D). Activation of the dopant 8.0 then takes place, this activation means that the dopant atoms are introduced into the crystalline lattice of the base plate 1.0. In this way, for example, the activation of a dopant such as arsenic displaces the arsenic atoms substituting tellurium atoms in the surface layer 2.0 and in the base plate 1.0. Activation leads to the formation of a p+ doped zone 9.0. The diffusion and activation of the dopant are generally grouped into a single diffusion and activation step.

This diffusion and activation step is optimised to diffuse the dopant until the interface between the p+ doped zone 9.0 and the remainder of the surface layer 2.0 and the base plate 1.0 is positioned near the heterojunction 3.0. This interface extends beyond the surface layer 2.0 into the base plate 1.0. A p+/n junction 10.0 will be formed on this interface as explained hereinafter. In parallel, this diffusion and activation step induces the formation of mercury gaps, doping, with p type doping, the entire substrate 100.0, including the base plate 1.0, surface layer 2.0 and p+ doped zone 9.0. The interface between the p+ doped zone 9.0 and the remainder of the base plate 1.0 and the surface layer 2.0 becomes a p+/p junction. For simplification purposes, this interface will be referred to as a p/n junction 10.0.

Preferably, it is attempted to position the p/n junction 10.0 in the base plate 1.0, at the boundary of the heterojunction 3.0, so that the p/n junction 10.0 is in a zone having an intermediate cadmium concentration between that of the base plate 1.0 and that of the surface layer 2.0.

Prior to or following the step for diffusing and activating the dopant, a passivation layer 5.0 wherein one of the elements is cadmium Cd, is deposited on top of the surface layer 2.0 (FIG. 2E). This purpose of this layer is to protect the p/n diode structure.

To convert the abovementioned p+/p junction into a p+/n junction 10.0, those skilled in the art would know to perform a step for filling the mercury gaps following the steps described above. The purpose of the step for filling the mercury gaps is to cancel the p doping induced by the formation of defects during the ion implantation and the step for diffusing and activating the dopant. Following this step for filling the gaps, the base plate 1 with a donor type dopant returns to n type doping (FIG. 2F). The p+/p junction then becomes a p+/n junction 10.0 commonly referred to as a p/n junction.

A conductor contact 6.0, preferably made of metal (FIG. 2G) is then added. This contact passes through the passivation layer 5.0 and enters the p+ doped zone 9.0 without reaching the base plate 1.0. The conductor contact 6.0 may be formed using conventional microelectronic techniques. It is then connected to an external electrical circuit not shown. Secondary contacts not shown are generally formed outside the diode and they are intended to create an electrical contact between the n-doped base plate 1.0 and the external electrical circuit. The two types of contacts operating in conjunction may help recover any current liable to appear at the p/n junction 10.0 for example under the influence of an electromagnetic wave.

The drawbacks of such a heterostructure diode are numerous.

The references in the text hereinafter refer to FIG. 2G illustrating a heterostructure p/n diode obtained using a method according to the prior art.

Firstly, it is difficult to grow a surface layer 2.0 made of $Hg_{1-y}Cd_yTe$ free from crystalline defects, and in particular, it is difficult to obtain a heterojunction 3.0 free from defects. In spite of the cost in time and money spent to reduce risks, defects are generally still present, weakening the p/n junctions 10.0 of the diodes and rendering them more sensitive to noise.

A second limitation is that the heterojunction 3.0 is present on the entire substrate 100.0. The possibility of having crystalline defects in the substrate 100.0, due to the presence of the heterojunction 3, is thus significant.

A third limitation lies in that the relative position of the p/n junction 10.0 in respect of the heterojunction is dependent on the diffusion of the dopant and in particular the implantation conditions and the diffusion and activation annealing conditions of the dopant. Dopant implantation and diffusion is a random and statistical phenomenon that it is difficult to control finely.

Using this method for producing heterostructure p/n diodes, the relative position of the p/n junction 10.0 in respect of the heterojunction 3.0 is thus difficult to control. It is never possible to be sure that the p/n junction 10.0, at the boundary of the heterojunction 3.0, reaches the base plate 1.0 or, conversely, that it does not protrude excessively therefrom.

Fourthly, as announced above, it is sought for the p/n junction 10.0 to be situated advantageously in the base plate 1.0, near the surface layer 2.0, where there is a cadmium concentration gradient. A small difference in depth of the p/n diode 10.0 between two adjacent diodes results in the p/n junction 10.0 being at a different point of the gradient and thus with a different cadmium concentration at the p/n junction 10.0. The p/n junction 10.0 may thus be positioned in different gap material from one diode to another.

By adding this phenomenon to that described above for the third limitation, it is noted that the precise cadmium concentration at the p/n junction 10.0 is difficult to predict and control. The performances of the diode, for example the quantum yield, the dark current on the wavelength range detected may thus vary from diode to diode. There is thus a risk of not obtaining the same signal for the same radiant flux from one diode to another.

DESCRIPTION OF THE INVENTION

A diode having a p/n junction heterostructure according to the invention and the method according to the invention are intended to reduce the impact of these limitations. In particular, they are intended to produce a heterostructure of superior quality, at a lower cost, to facilitate the control of a relative position of the p/n junction in respect of the heterojunction and enhance the reproducibility and repeatability of this relative position from one substrate to another and one diode to another in the same substrate.

The invention thus firstly relates to a device having at least one heterostructure p/n diode, comprising a substrate based on $Hg_{1-x}Cd_xTe$, mostly n-doped. The substrate comprises for each diode:
  a first part having a first cadmium concentration,
  a second part having a second cadmium concentration, greater than the first cadmium concentration, the second part, or concentrated part, forming a heterostructure with the first part,
  a p+ doped zone, or p doping zone, situated in the concentrated part and extending into the first part, and forming a p/n junction with a portion of the first part referred to as a base plate, which is n-doped.

The substrate is n-doped by introducing extrinsic donors.

The device according to the invention is characterised in that the concentrated part is only located in the p+ doped zone and forms a substantially constant cadmium concentration well. Such a device is suitable for solving the abovementioned problems. Indeed, as the heterostructure is contained in the p+ doped zone, it is not present in the substrate outside the diode(s) of the device. In this way, there can be no problems associated with the heterostructure between two adjacent diodes. Furthermore, the first part, having a first cadmium concentration, is accessible to undergo treatments at the edges of the diodes, without being coated by a surface layer having another cadmium concentration as is the case in the structures according to the prior art.

Preferentially, the well has a base situated at a substantially constant mean distance in respect of the p/n junction. In this way, a device according to the invention is suitable for controlling the performances of the diode, with a reduction in the variations in mean relative distance compared to the prior art.

When the device according to the invention comprises at least two adjacent heterostructure p/n diodes, the wells of the two adjacent diodes are separated and the mean relative distance in one of the two diodes is substantially equal to the mean relative distance in the other diode, providing a substantially identical position between the p/n junction and the heterojunction for each diode and reliability in respect of performances for each diode. Indeed, each diode having a substantially identical relative position between the p/n junction and the heterojunction, the performances of each diode are substantially identical.

The p+ doped zone is doped with an acceptor dopant which is advantageously arsenic.

The base plate is made of $Hg_{1-x}Cd_xTe$ where x has a value preferably between 0.15 and 0.95, for example 0.3. This value of x conveys a value of the cadmium concentration and is suitable for calculating same. The value of x is substantially equal to twice the value of the first cadmium concentration.

Similarly, the well is made of $Hg_{1-y}Cd_yTe$ where y has a value advantageously between 0.15 and 0.95, strictly greater than the value of x. The value of y conveys a value of the cadmium concentration and is suitable for calculating same. These values of x and y ensure that the diodes will be sensitive to wavelengths within an infrared spectrum. The value of y is substantially equal to twice the value of the second concentration.

Preferably, the values of x and y do not have an excessively large difference. In particular, this difference is less than 0.5 or 0.2. If the difference in the values between x and y were to be excessive, an excessive gap difference may be formed between the base plate and any conductor contact. This large gap difference would then need to be passed by any hole from an interaction between the electromagnetic wave and the base plate. This could give rise in some cases to a drop in the efficiency of the detection device or an increase in the power consumed.

The invention also relates to a method for producing a device having a least one heterostructure p/n according to the invention. This method comprises the following successive steps:
  a) ion implantation of an acceptor dopant in a substrate made of $Hg_{1-x}Cd_xTe$, comprising n type extrinsic donors, having a first cadmium concentration, called a base plate,
  b) diffusion and activation of the dopant implanted in the substrate, defining in the substrate a p+ doped zone which has a standard doping zone shape,
  c) deposition of a passivation layer wherein one of the elements is cadmium Cd, on top of the base plate and the p+ doped zone so as to protect the diode and limit mercury desorption from the diode, prior to or following step b),
  d) filling of mercury gaps initially present in the substrate or formed during the step for diffusing and activating the dopant. Following step d), any p doping induced by the mercury gaps disappears, the base plate artificially p-doped by the step for diffusing and activating the dopant becomes n-doped again and forms a p+/n junction, or p/n junction with the p+ doped zone.

The base plate is thus defined in step a) as a part of the substrate wherein there is no acceptor dopant.

The method according to the invention is characterised in that it comprises, preferentially before step d) and preferentially after step b) and step c), a step for the selective inter-diffusion of cadmium from the passivation layer into the p+ doped zone. In this way, a first part made of $Hg_{1-x}Cd_xTe$, having a first cadmium concentration, and a second part made of $Hg_{1-y}Cd_yTe$, or well or concentrated part, having a second cadmium concentration, which is substantially constant and greater than the first cadmium concentration of the base plate, are formed. The well is located inside the p+ doped zone. In this way, after step d) for filling the gaps, the well is circumscribed inside a zone defined by the p/n junction.

The selective inter-diffusion step of the method according to the invention is suitable for forming, automatically and without requiring external control, a second part, concentrated with cadmium, located in an optimised manner in respect of the p+ doped region and self-positioned. The diffusion being selective, it is controlled by operating conditions of the selective inter-diffusion step and by the shape of the p+ doped zone and thus, control of the shape of the p+ doped zone gives rise to control of the well. There is thus no risk of obtaining an unsuitably positioned heterostructure in relation to the p/n junction, the p/n junction being defined as being a boundary between the p+ doped zone and the n-doped base plate. Furthermore, the well, with a higher cadmium concentration, being obtained by diffusing cadmium in the initial crystalline lattice, has an identical crystalline lattice to an initial crystalline lattice of the substrate.

Preferably, step b) for diffusing and activating the dopant is performed before step c) for depositing the passivation layer.

It is possible to invert steps b) and c).

The selective cadmium inter-diffusion step advantageously comprises selective diffusion annealing. This is, preferably, performed at a temperature greater than 100° C. and for a time greater than one minute under pressure and temperature conditions limiting material degradation. The diffusion of cadmium in the p+ doped zone is thus controlled by the annealing temperature and time which are two parameters influencing the operating conditions of the selective inter-diffusion step. These parameters are identical for the entire substrate and are readily repeatable for the production of other devices according to the invention. In this way, on the same substrate, and from one substrate to another, the cadmium diffusion is substantially identical in respect of the p+ doped zone, even if, from one diode to another, the p+ doped zones have substantially different shapes. There is thus significant repeatability and reproducibility of the characteristics of the device according to the invention, in particular the p/n junction and the well are arranged with a substantially identical relative position for any diode from the same substrate or any substrate having undergone diffusion annealing under the same operating conditions.

The acceptor dopant is preferably arsenic.

Ion implantation, whether the dopant is arsenic or not, may take place with a dose typically between $10^{12}$ and $10^{16}$ at/cm$^2$.

The well, created by the method according to the invention, has boundaries forming an interface, or heterojunction, with the remainder of the substrate having the first cadmium concentration. The well being included inside the p+ doped zone, the heterojunction is also included inside the p+ doped zone. The well having a base and the method being intended to produce a plurality of p/n diodes simultaneously, the heterojunction, at the base of the well, is at a substantially identical mean relative distance from the p/n junction for all the diodes produced during the method, inside the p+ doped zone. In this way, the method according to the invention is such that it is suitable, due to the control of the temperature and duration of the inter-diffusion step, for positioning the heterojunction precisely and repeatably in relation to the p/n junction.

Finally, preferably, prior to the step for depositing the passivation layer, the entire substrate has a cadmium concentration which is the first concentration. This means that there is no surface layer made of HgCdTe having a different cadmium concentration to that of the substrate as is the case in the prior art. The method according to the invention thus enables significant financial gains since it is possible to produce heterostructure diodes without requiring a substrate comprising an epitaxial layer, requiring for the production thereof a long and costly treatment and which further may give rise to defect formation.

BRIEF DESCRIPTION OF THE FIGURES

The invention will be understood more clearly, and further details and advantages and features thereof will emerge on reading the following description given as a non-limiting example and with reference to the appended figures wherein.

Identical, similar or equivalent parts of the various figures bear the same reference numbers for easier transition from one figure to another.

The various parts shown in the figures are not necessarily on a uniform scale, to render the figures more legible.

The illustrative figures of the various embodiments of the device according to the invention are given as examples and are not limiting.

DETAILED DESCRIPTION OF PARTICULAR EMBODIMENTS

Figure 3:
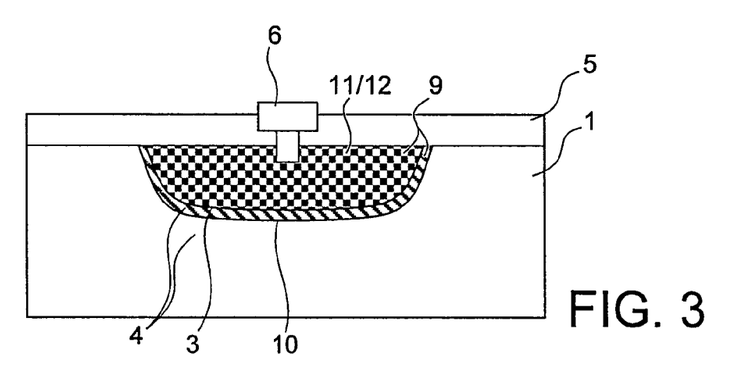
FIG. 3 illustrates a heterostructure p/n diode according to the device according to the invention.

The invention firstly relates to a device comprising at least one heterostructure p/n diode. Such a device according to the invention is illustrated in FIG. 3.

The heterostructure diode, present on a substrate 101, comprises a layer of semiconductor material, or base plate 1, which is n-doped, and this semiconductor material is of the $Hg_{1-x}Cd_xTe$ type. The base plate 1 made of $Hg_{1-x}Cd_xTe$ has a first cadmium concentration, characterised by a cadmium composition x of the base plate 1. The composition x is preferably between 0.15 and 0.95.

The value of x is advantageously between 0.15 and 0.25, for example 0.22, if it is sought to form a diode sensitive to infrared electromagnetic waves with so-called long wavelengths, known as long wavelength infrared (LWIR) particularly between 9 µm and 30 µm.

The value of x is advantageously between 0.25 and 0.4, for example 0.3, if it is sought to form a diode sensitive to infrared electromagnetic waves with so-called mid-wavelengths, known as mid-wavelength infrared (MWIR) particularly between 3 µm and 9 µm.

The value of x is advantageously between 0.4 and 0.95, for example 0.45, if it is sought to form a diode sensitive to infrared electromagnetic waves with so-called short wavelengths, known as short wavelength infrared (SWIR) particularly between 0.8 and 3 µm.

In one example of the invention, the value of x is substantially equal to 0.3.

The base plate 1 may be present on one side of a substrate not shown in FIG. 3. The base plate 1 may be present on any type of substrate suitable for receiving a layer of $Hg_{1-x}Cd_xTe$. However, if the diode is intended to be used in an imager, the substrate is chosen as being transparent to a given wavelength for which the imager is to be sensitive. In particular, the substrate is chosen as being transparent to an electromagnetic wave having an energy equal to the gap of the base plate. A further option is that of removing the substrate during subsequent steps, if the latter is not transparent or if this step enhances the performances of the compound.

On top of the base plate 1, there is a passivation layer 5 made of CdTe. This layer is in contact with the base plate 1.

The base plate 1 comprises on one side a p doping region acting as a p+ doped zone 9 which is not in contact with any substrate. The p+ doped zone 9 is doped using an acceptor type dopant for $Hg_{1-x}Cd_xTe$. Arsenic (As) is an advantageous dopant of this type. Further acceptor type dopants suitable for being used are for example phosphorus (P), antimony (Sb), bismuth (Bi), etc. or other atoms. These dopants, along with arsenic, are positioned in substitution of a tellurium atom during a dopant activation step. Lithium (Li), copper (Cu) or gold (Au), positioned in substitution of a cadmium or mercury atom, are also acceptor dopants suitable for use within the scope of the invention. Hereinafter in the description, we will describe the case of arsenic. It is obvious that the invention also relates to the other acceptor type dopants mentioned above.

The p+ doped zone 9 has a shape comparable to those found in the prior art, both for heterostructure p/n diodes, and for non-heterostructure p/n diodes. The p+ doped zone 9 is thus in contact with the passivation layer 5. The p+ doped zone 9 further extends in a finite fashion in the base plate 1, according to a conventional dopant diffusion profile, for example up to approximately 1 µm in depth in the base plate 1. The interface between the p+ doped zone 9 and the n-doped base plate 1 forms a p+/n junction or p/n junction 10.

There is advantageously a conductor contact 6 passing through the passivation layer 5 and entering the p+ doped zone 9, as in a diode according to the prior art.

The diode of the device according to the invention particularly differs from the prior art in that a part, called the concentrated part 11, with a higher cadmium concentration than the remainder of the base plate 1 is present in the majority of the p+ doped zone 9. The concentration part 11 consists of $Hg_{1-y}Cd_yTe$ having a cadmium concentration strictly greater than the first cadmium concentration. This second cadmium concentration is characterised by the cadmium composition y in the concentrated part.

The concentrated part 11 is in the form of an well 12, with a substantially constant cadmium concentration, having boundaries with the remainder of the substrate situated at the p/n junction 10. The substrate thus comprises a heterostructure consisting of the base plate 1 wherein at least one well 12 made of $Hg_{1-y}Cd_yTe$ with a strictly higher cadmium concentration than the base plate 1 is inserted.

The boundaries of the well 12, apart from the interface with the passivation layer 5, form a heterojunction 3 with the base plate 1 having a cadmium composition x. The heterojunction 3 is substantially situated at the p/n junction, but is always situated substantially inside the p+ doped zone 9. Indeed, advantageously, the heterojunction 3 is not overlaid with the p/n junction, but is found entirely inside the p+ doped zone 9. There is thus a part of the p+ doped zone 9 which is not at the second concentration.

The composition y is between 0.15 and 0.95, for example 0.5. The cadmium composition of the concentrated part 11 are advantageously substantially constant.

Preferably, the value of y is included in the same range of values mentioned above as x. The value of y may however be included in another range of values than x, among those mentioned above, if the difference between the values of x and y is not excessive. In particular, this difference is typically less than 0.5. Measures will be taken to ensure that the difference between x and y is not greater. Otherwise, a significant gap difference may be formed between the base plate and any conductor contact present in the diode. It will be necessary for this significant gap difference to be overcome by any hole from an interaction between the electromagnetic wave and the base plate. This could cause a drop in the efficiency of the detection device or an increase in the power consumed.

The substrate according to the invention thus comprises, in a first approximation, a first part 4 having a first cadmium concentration, comprising the n-doped base plate 1, and a part of the p+ doped zone 9 which is not at the second concentration.

Preferably, an intermediate zone having an intermediate cadmium concentration between the first concentration, in the base plate 1, and the second concentration, in the well 12, is situated at the p/n junction 10, but outside the well 12.

The intermediate zone extends preferably at least on the entire p+ doped zone 9 which is not at the second concentration. This intermediate zone has a cadmium concentration gradient between the first concentration and the second concentration in the form of a conventional diffusion profile. In this way, when a thermodynamic equilibrium is reached, a space charge zone, not shown, is formed around the p/n junction 10, the space charge zone is mostly made of a material having either the intermediate concentration, or the second concentration, i.e. that it mostly has a higher cadmium concentration than the first concentration. Consequently, the space charge zone is made of a material with a larger gap than the material gap of the base plate 1. Advantageously, the p/n junction is such that a first boundary of the space charge zone is in the base plate 1 or in a part of the intermediate zone having a cadmium concentration close to that of the base plate 1 and that a second boundary of the space charge zone is in the well 12 or in a part of the intermediate zone having a cadmium concentration close to that of the well 12.

The well 12 having a base, the heterojunction 3 formed by the boundaries of the well 12 and the p/n junction 10 formed by the boundaries of the p+ doped zone 9 are separated on average, at the base of the well 12, by a given mean relative distance. The heterojunction 3 and the p/n junction 10 then have a given relative position. If there are a plurality of p/n diodes in the device according to the invention, the relative positions of the heterojunctions 3 and the p/n junctions are substantially identical for all the diodes produced during the method.

In this way, in a p/n diode as present in the device according to the invention, there is a heterostructure 3 reducing the noise in the p/n diode. Furthermore, the heterojunction 3 is only present in the device in the vicinity of the p/n junction 10 and the heterojunction is produced without forming interface defects.

The invention also relates to a method for producing a device according to the invention. Such a method according to the invention is described hereinafter with reference to FIGS. 4A to 4G.

Figure 4A:
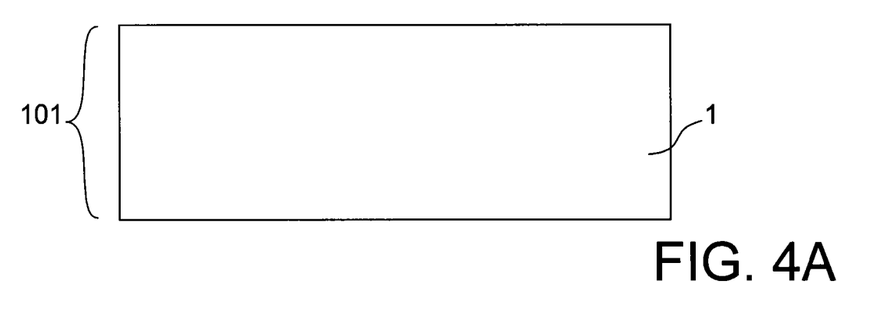
FIGS. 4A to 4G illustrate various steps of a method according to the invention.
Figure 4B:
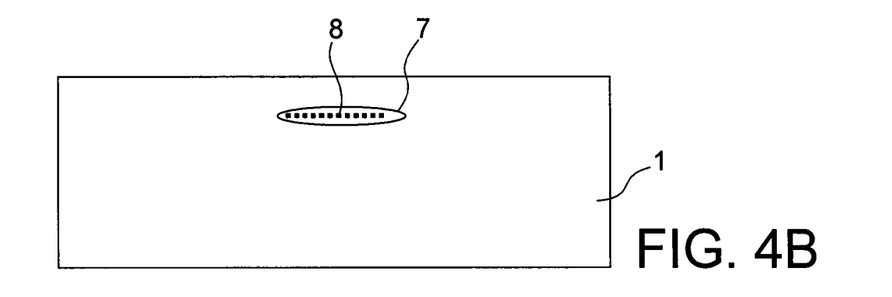

Firstly, a substrate 101 comprising a layer, or base plate 1, of $Hg_{1-x}Cd_xTe$ type material having a first cadmium concentration and composition as defined above, is chosen (FIG. 4A). The base plate 1 may have a thickness from a plurality of micrometers to some tens of micrometers, for example 10 µm. It may for example have been formed by molecular beam epitaxy (MBE) or by liquid phase epitaxy (LPE). Preferably, the base plate 1 initially comprises an n doping zone formed by an extrinsic donor type dopant introduced during the formation thereof, for example indium. This dopant may have low density, known to those skilled in the art, for example typically between $1.E^{14}$ at/cm$^3$ and $5.E^{16}$ at/cm$^3$. If the dopant is not introduced during the formation of the base plate 1, it is added before the steps cited above.

Subsequently, as for the method according to the prior art, localised ion implantation of an acceptor type dopant 8 (FIG. 4B) in the form of dopant atoms is performed. The dopant may be one of those previously cited in the description of the device, particularly arsenic. Standard implantation conditions are for example an energy of 500 KeV and an implantation dose of $2.E^{15}$ at/cm$^2$. Further ion implantation conditions can be used according to the sought performances for the diode and are known to those skilled in the art. The implantation energy may vary between for example 10 KeV and 600 KeV and the implantation dose may vary typically between $10^{12}$ and $10^{16}$ at/cm$^2$. Dopant 8 is found implanted in an implantation zone 7, embedded in the base plate 1. There may optionally be simultaneous implantation of a plurality of dopants.

Subsequently, a step for diffusing and activating the dopant (FIG. 4C) is preferably performed. This step is advantageously completed using dopant diffusion and activation annealing. The dopant atoms then diffuse in three directions: along two directions defining a main surface 13 of the base plate 1, and in a direction 13' perpendicular to this main surface 13. During annealing, mercury gaps are formed and induce p doping throughout the substrate, including in the initially n-doped base plate 1.

Figure 4C:
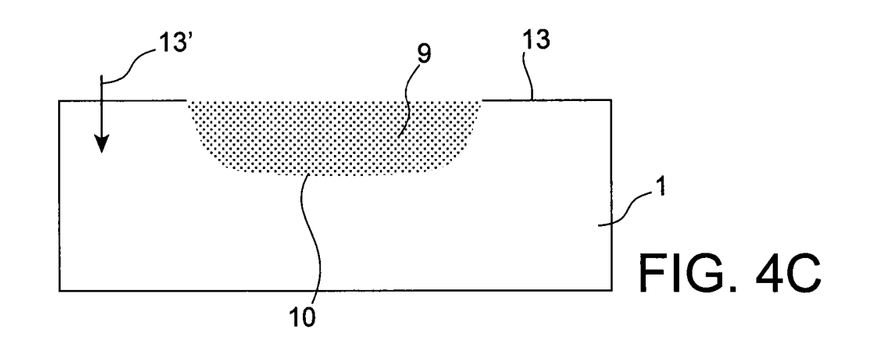

While diffusing, the dopant atoms are activated. This means that they are positioned so as to give a supplementary p polarity in the material in which they are. With the implantation doses generally used, the supplementary polarity induces p+ doping in the material where the dopant is diffusing. For an arsenic dopant, activation consists of positioning the arsenic dopant atoms as a substitution of tellurium atoms. The diffusion and activation annealing generally takes place under saturating mercury pressure, at a temperature preferentially between 300° C. and 500° C., for a time preferentially between a few minutes and a few hours. One particular example is a temperature of 440° C. and a time of 5 hours. It is obvious that those skilled in the art would be able to adapt the dopant diffusion and activation annealing time and temperature according to the type of dopant used, implantation doses used and the type of use envisaged for the diode.

In the p+ doped zone 9, after diffusion and activation, the acceptor dopant atoms may have a density typically between $10^{15}$ and $10^{20}$ at/cm$^3$. A passivation layer 5 wherein one of the elements is cadmium Cd is then deposited on top of the base plate 1. This layer may be obtained by means of physical vapour deposition (PVD) or by any other technique. This layer has a thickness typically between 0.5 micrometers and 5 micrometers, for example 1 micrometer.

Figure 4D:
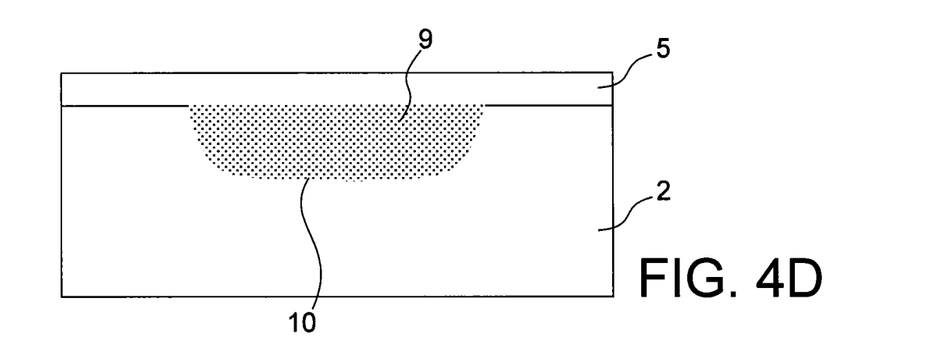

The dopant diffusion and activation annealing is then performed, if not performed before depositing the passivation layer 5.

Figure 4E:
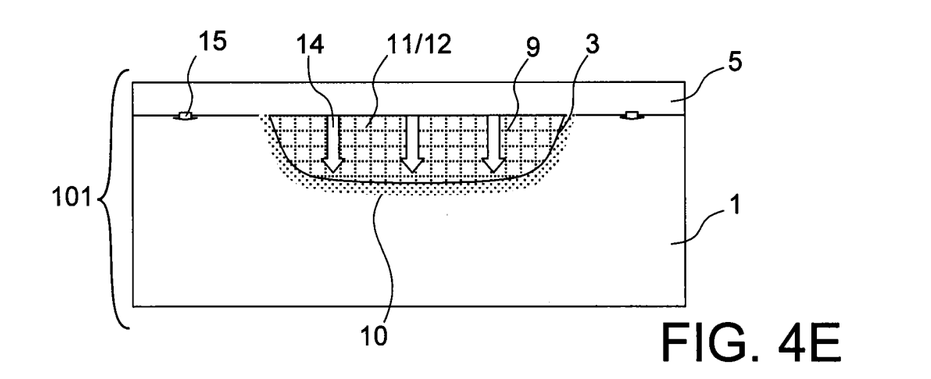
Figure 4F:
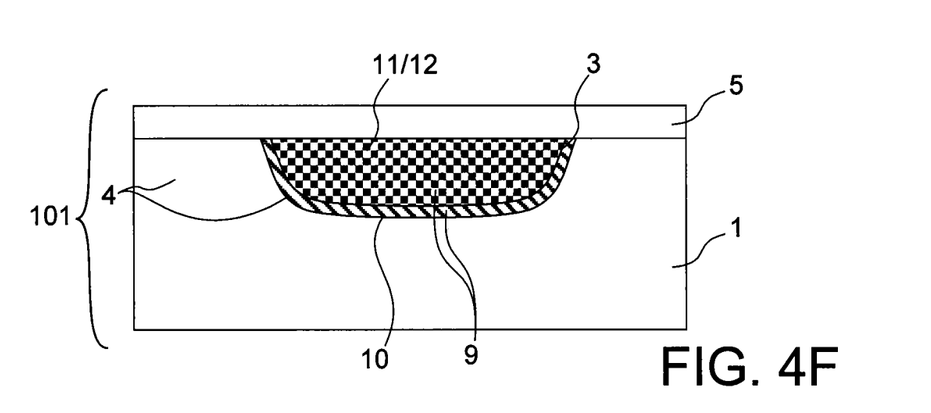

The inventors then propose a step for the selective interdiffusion of cadmium (FIG. 4E). This step induces diffusion of cadmium from the passivation layer 5, rich in cadmium, to the base plate 1 and particularly selectively to the p+ doped zone 9 present in the base plate 1, p-doped with the mercury gaps.

For this purpose, selective diffusion annealing is advantageously performed, with a temperature greater than 100° C. The annealing may have a duration greater than one minute. In particular, the selective diffusion annealing preferably has a temperature less than 400° C. so as to limit any further diffusion of the dopant.

Cadmium diffusion is an ionic diffusion. This means that cadmium atoms diffuse in the form of Cd$^{2+}$ ions via interstitial sites. A characteristic diffusion length D may be expressed as follows:

$$D = \left(\frac{p}{n_i}\right) D_{Cd+}$$

where $D_{Cd+}$ is a cadmium diffusion coefficient at a given temperature, p is a hole density value and $n_i$ is an intrinsic carrier density in the base plate 1.

Cadmium diffusion will thus be facilitated if a ratio [(hole density)/$n_i$], or diffusion ratio, increases. Conversely, in a doping region wherein the diffusion ratio is less than 1, the cadmium diffusion will be low.

Diffusion thus takes place selectively in the p+ doped zone 9, where the carrier density is in the region of $10^{17}$ to $10^{20}$ at/cm$^3$, in relation to the rest of the base plate 1. Indeed, the base plate 1, although p-doped, has an excessively low hole density in relation to the intrinsic carrier density. The diffusion is considered to be instantaneous throughout the p+ doped zone 9, while the density of the acceptor dopant, in this case arsenic, is greater than $n_i$.

Cadmium thus has, in the p+ doped zone, a selective diffusion length 14 which is much greater than the standard diffusion length 15 of cadmium, in the p-doped base plate 1. The selective diffusion annealing time and temperature are adjustable so as to control the selective diffusion length 14 of cadmium in the p+ doped zone 9 and the quantity of diffusing cadmium.

During the selective diffusion annealing of cadmium, cadmium diffuses essentially in the p+ doped zone. A well 12 of $Hg_{1-y}Cd_y$Te is thus formed, having a second cadmium concentration, which is substantially constant and richer in cadmium than the base plate 1. The interface between the well 12 and the base plate 1 is called a "heterojunction 3". As cadmium essentially diffuses where arsenic is present in a quantity greater than the intrinsic carrier density $n_i$, this means that the well 12 is entirely included in the p+ doped zone 9 and that the heterojunction 3 does not protrude from the p/n junction 10. Between the well 12, having a constant concentration, and the base plate 1, there is an intermediate zone where the cadmium concentration is intermediate between the first concentration of the base plate 1 and the second concentration of the well 12. The intermediate zone will be described in more detail in conjunction with FIGS. 6A and 6B. The intermediate zone comprises a cadmium diffusion gradient in the base plate, referred to in the invention as "intermediate profile". The intermediate zone and the base plate 1, are two portions of the substrate which are at a different concentration to the second cadmium concentration and they define a first part 4 together. On the other hand, if a plurality of diodes are formed, all the wells 12 of the various diodes may be considered to belong to a second part, having a second cadmium concentration which is substantially constant at all points.

Controlling the selective diffusion length 14 and the quantity of cadmium diffused ensures that two important parameters are controlled precisely: the value of the second cadmium concentration in the well 12, the shape of the intermediate profile. Furthermore, if a plurality of diodes are produced on the substrate 101, as the cadmium diffusion is considered to be instantaneous in the p+ doped zone 9, the relative position between the heterojunction 3 and the p/n junction is also set in substantially the same way for all the diodes included on the substrate 101.

The selective diffusion annealing temperature and time are control means for setting both the cadmium concentration in the well 12 and the shape of the diffusion profile of the intermediate zone and the length thereof.

Indeed, if the temperature is low, the cadmium diffusion coefficient is too low for the diffusion to be significant. However, if the temperature is too high, the diffusion coefficient is high, but arsenic could then diffuse, which would modify the shape of the p+ doped zone 9. It is possible to find an optimal diffusion temperature and time for obtaining the sought cadmium inter-diffusion without modifying the p+ doped zone 9. The selective diffusion annealing temperature thus has an important role and the control thereof is suitable for significant diffusion control and enables variations of the diffusion profile and the quantity of diffused cadmium. Adjusting the annealing time enables more restricted but more controllable variations.

Controlling the length of the intermediate zone and the intermediate profile helps control the cadmium concentration at the p/n junction 10 and in the space charge zone. It is thus possible to control in a fine and repeatable manner the gap at the p/n junction 10 and the performances of the p/n diode only by varying the annealing temperature and/or time and without requiring control of the dimensions of the p+ doped zone 9.

Following the selective inter-diffusion step, the method is continued with conventional steps. A step for filling the mercury gaps (FIG. 4F) is performed, whereby the p-doped base plate 1, becomes n-doped again, the acceptor type mercury gaps having been filled. This step may comprise low-temperature annealing, at a temperature between 150° C. and 350° C., for example 250° C. during a period between a few minutes and several days, for example one day or two days.

Figure 4G:
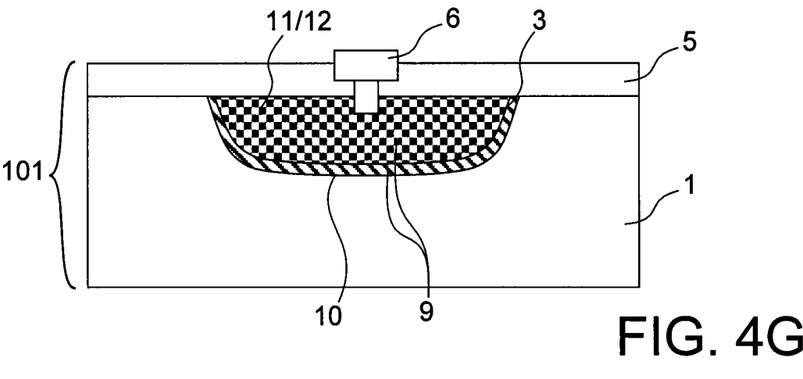

Subsequently, a conductor contact 6, for example made of metal, passing through the passivation layer 5 and entering the p+ doped zone 9 (FIG. 4G).

The method described above is suitable for obtaining a p/n diode having a heterostructure such that the heterojunction 3 is located in the close surrounding area of the p/n junction 10 of the diode, preferably inside a volume defined by the p/n junction. This heterostructure is self-positioned, i.e. the embodiment and the relative position of the heterostructure in relation to the p/n junction 10 are due only to steps of the method treating the substrate 101 overall, without any local treatment step such as etching, local insolation, etc. This limits local variations of parameters such as variations from one p/n diode to another.

The method according to the invention is suitable for obtaining the device having at least one p/n diode according to the invention. The inventors were able to demonstrate that cadmium concentration profiles, obtained by means of secondary ion mass spectrometry (SIMS), are linked with arsenic atom concentration profiles.

Figure 5:
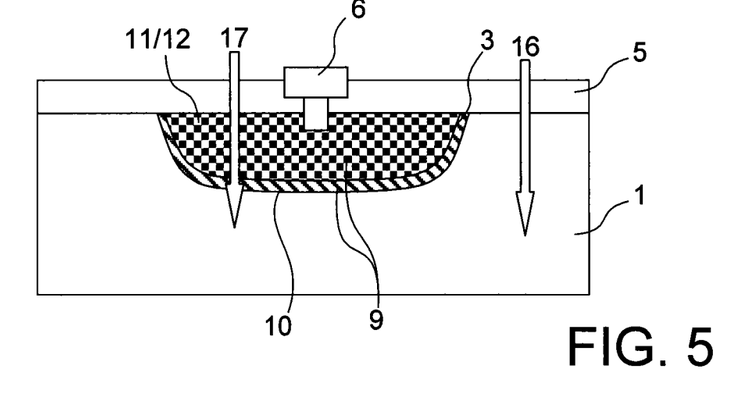
FIG. 5 illustrates the positioning of two SIMS measurement points on a diode according to the invention.

FIG. 5 illustrates a device according to the invention comprising a p+ doped zone 9, a well 12 with a higher cadmium concentration, and a passivation layer 5 positioned in contact with the p+ doped zone 9 and with portions of the substrate having n doping and forming a base plate 1.

Two concentration profile measurements by means of secondary ion mass spectrometry (SIMS) were made. Cadmium and arsenic concentration profiles were measured. A first measurement 16 was made, along the arrow 16 shown in FIG. 5, at a point where the passivation layer 5 is in contact with the n-doping base plate 1. A second measurement 17 was made, along the arrow 17 shown FIG. 5, at a point where the passivation layer 5 is in contact with the p+ doped zone 9.

Figure 6A:
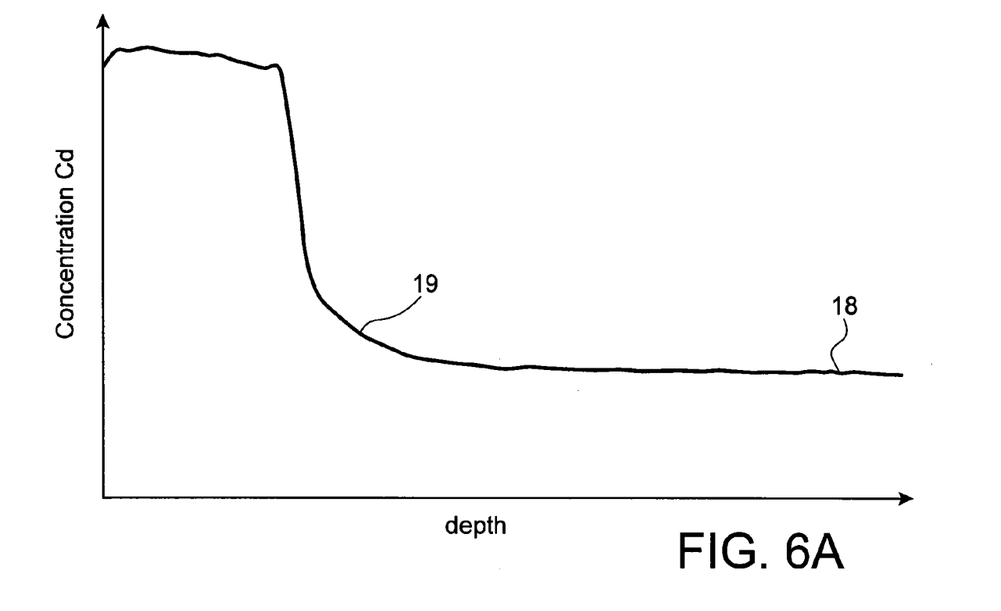
FIGS. 6A and 6B illustrate the concentration profiles for cadmium, on one hand, and for cadmium and arsenic, on the other, obtained for two measurements on the diode according to the invention.

FIG. 6A illustrates the cadmium concentration profile obtained during the first measurement. The y-axis shows the concentration measured in arbitrary units and the x-axis shows a depth measurement in the substrate, in arbitrary units, such that an outer surface of the passivation layer 5 is considered to be origin of the y-axis. The references to structural elements of the diode should be read with reference to FIG. 5.

The cadmium concentration profile 18 has a peak plateau which seems to identify the passivation layer 5. A drop in concentration corresponding to the transition into the base plate 1 of $Hg_{1-x}Cd_xTe$ can then be observed. It continues rapidly into a final cadmium plateau corresponding to the cadmium concentration in the base plate 1. In the base plate 1, close to the passivation layer 5, a slight cadmium gradient 19 greater than the quantity of cadmium present in the remainder of the base plate 1 is observed. This gradient 19 is the sign of limited cadmium diffusion in the base plate 1 from the passivation layer 5.

In this measurement, the quantity of arsenic is not evaluated as it is not present.

Figure 6B:
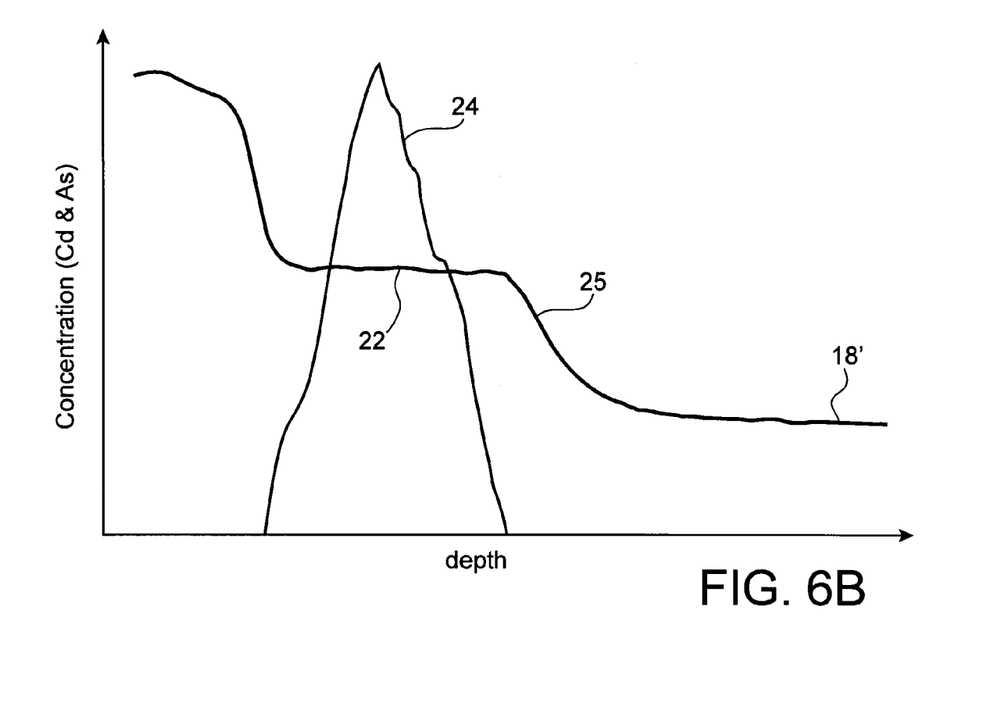

FIG. 6B illustrates the concentration profiles obtained during the second measurements. The y-axis shows the concentration measured in arbitrary units and the x-axis shows a depth measurement in the substrate, in arbitrary units, such that an outer surface of the passivation layer 5 is considered to be the origin of the y-axis.

Starting from the zero y-axis, a zone is observed wherein the cadmium profile 18' is maximal. This zone corresponds to the passivation layer 5. In the increasing y-axis direction, a first drop in the profile is observed, followed by a cadmium plateau 22. Following the cadmium plateau 22, a second drop in the profile 25 is exhibited. The plateau 22 defines a zone corresponding to the well 12 of the second cadmium concentration. The second drop in the cadmium profile 25 corresponds to the intermediate zone mentioned above, comprising a cadmium concentration gradient of intermediate values between the first concentration and the second concentration.

The cadmium profile 18' corroborates the formation of a well made of $Hg_{1-x}Cd_yTe$ wherein the value of the composition y is greater than the value x conveying the first cadmium concentration in the base plate 1.

An arsenic profile 24 obtained during the second measurement is then studied. A peak of the arsenic profile 24 along the length of the cadmium plateau 22 can be observed overlaid on the cadmium plateau 22. In view of the method, wherein the cadmium diffusion takes place after any diffusion of arsenic, this overlay demonstrates that cadmium diffusion takes place in a zone defined by the presence of arsenic.

The positioning of the p/n junction 10 may be observed. The p/n junction, according to an observation of the profiles in FIG. 6B, is situated at the profile drop 25 of the cadmium profile 18'. It can thus be observed that the p/n junction is situated at a greater depth than the well 12, in the intermediate zone identified by the concentration gradient of the second drop in the cadmium profile 25. The intermediate zone straddles a region of the n-doped base plate 1 and the p+ doped zone 9.

Those skilled in the art will readily understand that it is possible to modulate the length and concentration of cadmium in the gradient of the profile drop 25 using the selective diffusion annealing operating conditions as mentioned above.

Such a SIMS analysis demonstrates that the method according to the invention is indeed capable of producing heterostructure diodes 3 self-positioned in a base plate 1 of $Hg_{1-x}Cd_xTe$ and controlling the cadmium concentration in the p/n junction 10 of the diode and in the space charge zone formed around the p/n junction.

The method and the device according to the invention are suitable for obtaining diode arrays or single diodes for producing in particular infrared imagers capable of detecting low-energy electromagnetic waves while minimising the noise and dark current and having superior homogeneity in respect of diode performances.

The invention claimed is:

1. A device comprising at least one heterostructure p/n diode, comprising a substrate based on HgCdTe, mostly n-doped, the substrate comprising for each diode:
    a first part having a first cadmium concentration;
    a second part having a second cadmium concentration, greater than the first cadmium concentration, the second part, or concentrated part, forming a heterostructure with the first part;

a p+ doped zone, or p doping zone, situated in the concentrated part and extending into the first part, and forming a p/n junction with an n-doped portion of the first part, or a base plate; wherein the concentrated part is only located in the p+ doped zone and forms a substantially constant cadmium concentration well.

2. A device according to claim 1, wherein the well includes a base situated at a substantially constant mean distance in respect of the p/n junction.

3. A device according to claim 2, comprising at least two adjacent heterostructure p/n diodes, and the wells of the two adjacent diodes are separated and the mean relative distance in one of the two diodes is substantially equal to the mean relative distance in the other diode.

4. A device according to claim 1, wherein the p+ doped zone is doped with an acceptor dopant.

5. A device according to claim 4, wherein the acceptor dopant is arsenic.

6. A device according to claim 1, wherein the base plate is made of $Hg_{1-x}Cd_xTe$ where x has a value between 0.15 and 0.95 and conveys the first cadmium concentration.

7. A device according to claim 6, wherein the well is made of $Hg_{1-y}Cd_yTe$ where y has a value greater than 0.15 and less than or equal to 0.95, strictly greater than the value of x, and conveys the second cadmium concentration.

8. A method for producing a device including at least one heterostructure p/n diode, comprising:
   a) ion implantation of an acceptor dopant in a substrate made of $Hg_{1-x}Cd_xTe$, having a first cadmium concentration, comprising n type extrinsic donors, as a base plate;
   b) diffusion and activation of the dopant in the substrate, defining a p+ doped zone in the substrate;
   c) deposition of a passivation layer, wherein one of the elements is cadmium Cd, on top of the base plate and the p+ doped zone, prior to or following b);
   d) filling of mercury gaps initially present in the substrate or formed during the diffusing and activating the dopant, the base plate becoming n-doped and forming a p+/n junction, or p/n junction, with the p+ doped zone; and before d) and after b) and c), selective inter-diffusion of cadmium from the passivation layer into the p+ doped zone, forming a first part made of $Hg_{1-x}Cd_xTe$, having a first cadmium concentration, and a second part made of $Hg_{1-y}Cd_yTe$, or well or concentrated part, having a second cadmium concentration, which is substantially constant and greater than the first cadmium concentration, the well being located inside the p+ doped zone.

9. A method according to claim 8, wherein the selective cadmium inter-diffusion comprises selective diffusion annealing performed at a temperature greater than 100° C. and for a time greater than one minute.

10. A method according to claim 8, wherein the acceptor dopant is arsenic.

11. A method according to claim 8, wherein the well includes boundaries forming an interface, or heterojunction located at the p/n junction, the well including a base, and the method to produce a plurality of p/n diodes simultaneously, the heterojunction, at the base of the well, is at a substantially identical mean relative distance from the p/n junction for all the diodes produced during the method, inside the p+ doped zone.

12. A method according to claim 8, wherein prior to the deposition of the passivation layer, the entire substrate has a cadmium concentration which is the first concentration.

13. A method according to claim 8, where said P+ doped zone occupies all of the volume of the concentrated part.

* * * * *